United States Patent
Lawrence et al.

(10) Patent No.: US 6,867,701 B2
(45) Date of Patent: Mar. 15, 2005

(54) COMPUTER-SERVER RACK ENCLOSURE FAULT LIGHT DIAGNOSTIC SYSTEM

(75) Inventors: Bradley Michael Lawrence, Durham, NC (US); David Frederick Champion, Durham, NC (US); Daniel Paul Kelaher, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 10/124,987

(22) Filed: Apr. 18, 2002

(65) Prior Publication Data

US 2003/0197619 A1 Oct. 23, 2003

(51) Int. Cl.[7] .............................................. B08B 21/00
(52) U.S. Cl. ................ 340/635; 340/545.6; 340/545.9; 340/3.43; 361/684; 361/685; 369/30.3; 369/30.92
(58) Field of Search ................................ 340/635, 542, 340/545.6, 545.9, 570, 630, 555, 3.43, 5.9, 5.91, 5.92, 543, 652, 653, 815.45; 369/30.54, 30.92; 235/385; 361/679, 674, 684, 683

(56) References Cited

U.S. PATENT DOCUMENTS

| | | | |
|---|---|---|---|
| 4,706,073 A | * 11/1987 | Vila Masot | 340/639 |
| 5,394,459 A | 2/1995 | Djuphammar et al. | 379/15 |
| 5,754,112 A | 5/1998 | Novak | 340/635 |
| 5,790,374 A | * 8/1998 | Wong | 361/685 |
| 5,850,539 A | 12/1998 | Cook et al. | 395/500 |
| 5,877,938 A | 3/1999 | Hobbs et al. | 361/724 |
| 6,061,244 A | 5/2000 | O'Sullivan et al. | 361/727 |
| 6,459,571 B1 | * 10/2002 | Carteau | 361/684 |

FOREIGN PATENT DOCUMENTS

| | | | | |
|---|---|---|---|---|
| DE | 4419190 | 12/1995 | | G05B/23/02 |
| JP | 6069670 | 3/1994 | | H05K/7/18 |

* cited by examiner

*Primary Examiner*—Davetta W. Goins
(74) *Attorney, Agent, or Firm*—Randall J. Bluestone; Harrington & Smith, LLP

(57) ABSTRACT

A computer-server rack enclosure fault light diagnostic system and a method for providing an overall rack level fault indicator of a fault incurred by a unit of electronic equipment housed in the rack. The rack may be an EIA standard rack holding constituent components complying with EIA standards.

15 Claims, 3 Drawing Sheets

COMPUTER-SERVER RACK ENCLOSURE FAULT LIGHT DIAGNOSTIC SYSTEM

BACKGROUND OF THE INVENTION

1. Field of the Invention

The present invention relates to a fault indication system. More particularly, the present invention relates to a computer-server rack enclosure fault diagnostic system for providing an overall rack level fault indication.

2. Description of the Related Art

Rack mount servers provide an effective way of aggregating a large number of servers, and thus storage capacity, in a relatively small space. Rack mounted servers are typically mounted in vertical racks that comply with Electronic Industry Association (EIA) specifications. EIA standard rack mount equipment is housed in a chassis or housing 19" wide. EIA compliant server and other electronic equipment can be readily mounted into the EIA standard rack.

In an effort to monitor, test, and maintain rack mounted electronic equipment, numerous systems and methods have been proposed for indicating, and/or detecting fault occurrences experienced by the electronic equipment mounted in the rack. For example, U.S. Pat. No. 5,394,459 to Djuphammar et al. discloses a plurality of telecommunication cabinets stacked in columns or rows in a station rack. Djuphammar et al discloses each cabinet as being equipped with an error LED that is lit when any circuit board assembly of unit in the cabinet indicates an error is present. U.S. Pat. No. 5,754,112 to Novack discloses a plurality of memory storage units plugged into SCA-connector bays in a console rack, wherein the SCA-connector bays are mounted on the system backplane within the console rack. For each bay-mounted SCA-connector, there is disclosed a logic circuit that includes the system backplane. The logic circuit includes a resistor and two parallel-coupled LEDs. One of the LEDs is located on the console bay adjacent a bay opening, and the second LED is mounted on a visible (i.e., outer) surface of the console rack. Both the Djuphammar et al. and the Novack disclosed systems provide a component level indication of the status of the individual electronic equipment units.

Modern high density servers, often designed to run mission critical applications, require sufficient ventilation and cooling to ensure that the server maintains a high level of availability. High density rack mounted servers should also be secure from unintended and unauthorized access. To address both of these concerns, an EIA standard rack server may typically have a finely perforated, lockable metal door that provides both a sufficient amount of ventilation and security. However, while the perforations provide the requisite security and ventilation (given, for example, a rack mounted fan), the finely sized and spaced perforations (i.e., holes) inhibit visual inspection and determination of a fault occurrence of any of the electronic equipment in the rack.

Accordingly, the Djuphammar et al. and Novack systems discussed above for example, with their individual constituent unit fault indicators, cannot provide a visual fault indication when housed in a modern server rack having a perforated door that substantially obscures direct viewing of the electrical equipment housed in the rack. Furthermore, each of the examples discussed above requires a common backplane, complex cabling, and/or specialized circuitry for each unit in the rack to provide an indication of the monitored electronic equipment unit.

Therefore, there exists a need to provide a computer-server rack enclosure fault diagnostic system for providing a visual, overall rack level fault indication for enabling a quick and precise determination of whether a rack is housing electronic equipment exhibiting a fault.

SUMMARY OF THE INVENTION

The inventors of the present invention have realized a rack alert system and a method for providing an overall rack fault indication by the rack alert system, the rack alert system having a rack enclosure having a door attached thereto, a unit of electronic equipment housed in the rack enclosure, a fault indicator located on the unit of electronic equipment for indicating the unit of electronic equipment has incurred a fault, a transceiver located on or in an interior surface of the door, the transceiver in opposing spaced apart relation to the fault indicator when the door is closed; and a rack fault indicator, located in or on an exterior surface of the rack enclosure, for indicating an overall rack level fault in response to the transceiver detecting a signal indicative of a fault generated by the fault indicator.

The above and other objects, advantages, and benefits of the present invention will be understood by reference to following detailed description and appended sheets of drawings.

DETAILED DESCRIPTION OF THE INVENTION

Figure 1:
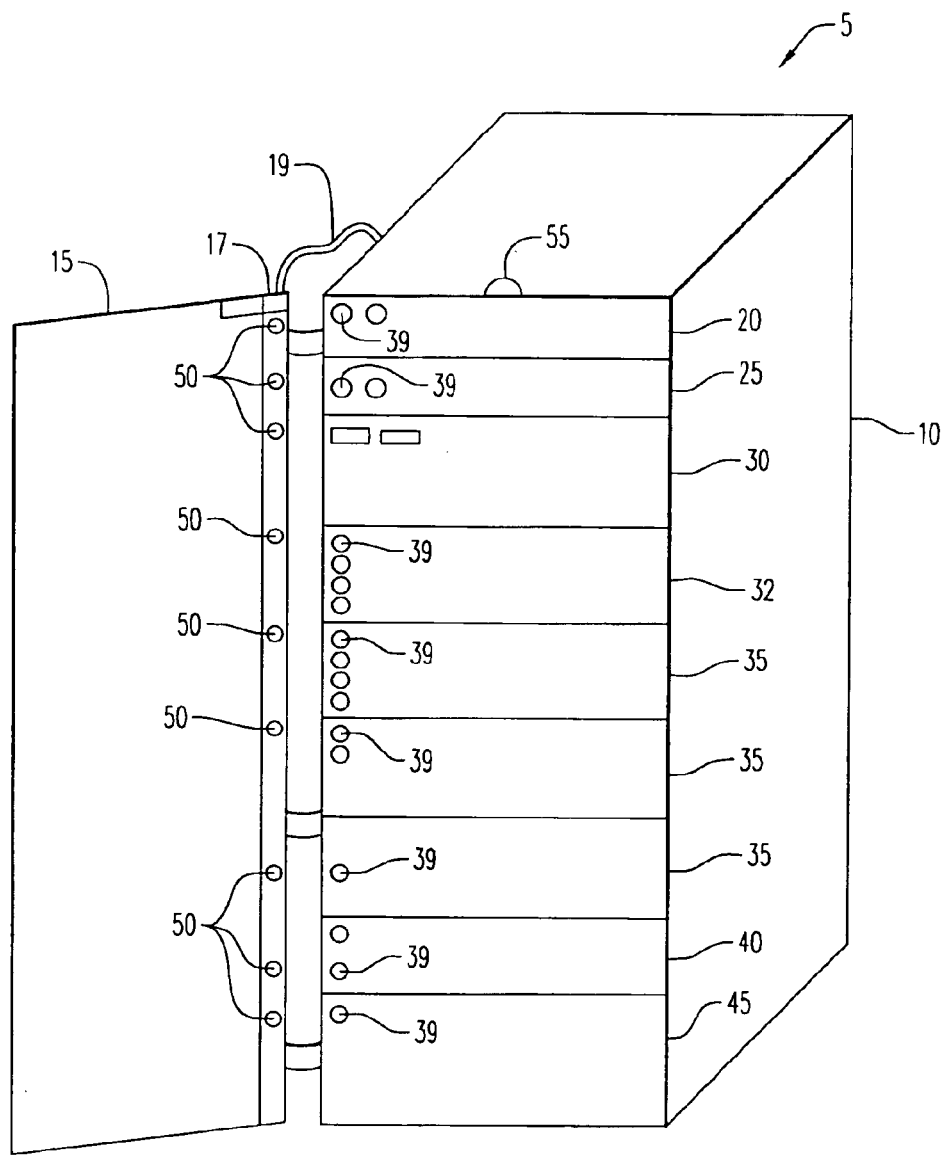
FIG. 1 is a perspective view of a computer-server rack enclosure fault light diagnostic system in accordance with the present invention.

Referring to the drawings and in particular FIG. 1, there is provided a computer-server rack enclosure fault light diagnostic system in accordance the present invention, generally represented by reference numeral 5. Rack enclosure fault diagnostic system 5 (also referred to herein as rack alert system) includes a rack enclosure 10 having a door 15 attached thereto. Rack enclosure 10 preferably complies with EIA standards regarding its width, depth, and other physical and mechanical characteristics.

It should be appreciated that rack enclosure 10 is not limited to being an EIA compliant rack, and other standard and non-standard racks, housings, and enclosures may be used without departing from the scope of the present invention. That is, the teachings of the present invention may be extended to include non-EIA compliant racks and housings.

Exemplary rack alert system 5 has a plurality of rack mounted electronic equipment mounted in rack enclosure 10. As depicted in FIG. 1, rack enclosure 10 houses a switch 20 for connecting separate network segments, a hub 25, an expansion unit 30, a RAID (Redundant Array of Independent Disks) controller 32, a plurality of servers 35, a UPS (Uninterruptible Power Supply) 40 for maintaining a continuous supply of power to the electronic equipment in rack enclosure 10 in the event of a loss of incoming (i.e., line) power, and a PDU (Power Distribution Unit) 45 for control and distribution of power to connected servers 35 and other inter-connected equipment (e.g., 20, 25, 30, 32, and 40) in rack enclosure 10.

Door 15 is preferably attached to rack enclosure 10 by hinges so that door 15 may be opened to gain access to the electronic equipment housed in rack enclosure 10. Other means of attaching door 15 to rack enclosure 10 may be used. As mentioned above, door 15 provides a level of security to the equipment housed in rack enclosure 10. Door 15 may optionally be equipped with a locking mechanism. However, for various purposes such as maintenance and testing for example, door 15 can be opened or removed from rack enclosure 10 for accessing the electronic equipment housed therein.

Given modern high density rack mount servers and the heat generated by them, it is operationally important and crucial to adequately cool the electronic equipment mounted in the rack. Accordingly, door 15 is provided with finely sized and spaced perforations (not shown) therein to facilitate ventilating rack enclosure 10, while not compromising the security aspects afforded by the door. Ventilation of rack enclosure 10 electronic equipment may be aided by a fan(s) that moves air across the electronic equipment in a front to back, top to bottom, or a combination thereof, air flow pattern through rack enclosure 10.

While providing sufficient openings for ventilation of rack enclosure 10, the finely spaced and sized perforations do not provide a clear line of sight to the electronic equipment housed therein. Thus, a front panel visual indicator located on the rack mount electronic equipment is not visible when door 15 is in a closed position.

In an aspect of the present invention, the electronic equipment depicted in FIG. 1, including exemplary servers 35, has at least one indicator such as a light source (e.g., an LED) on the front panel thereof. The light source(s) on the front panel of server 35 preferably include an alert indicator LED 39. Alert indicator LED 39 is illuminated when server 35 experiences a fault, error, alert or predetermined status in the operation of server 35. The fault, error, alert or predetermined status may be any parameter related to the operation (i.e., health) of server 35, including, but not limited to, parameters monitored by a diagnostic function of server 35.

Figure 2:
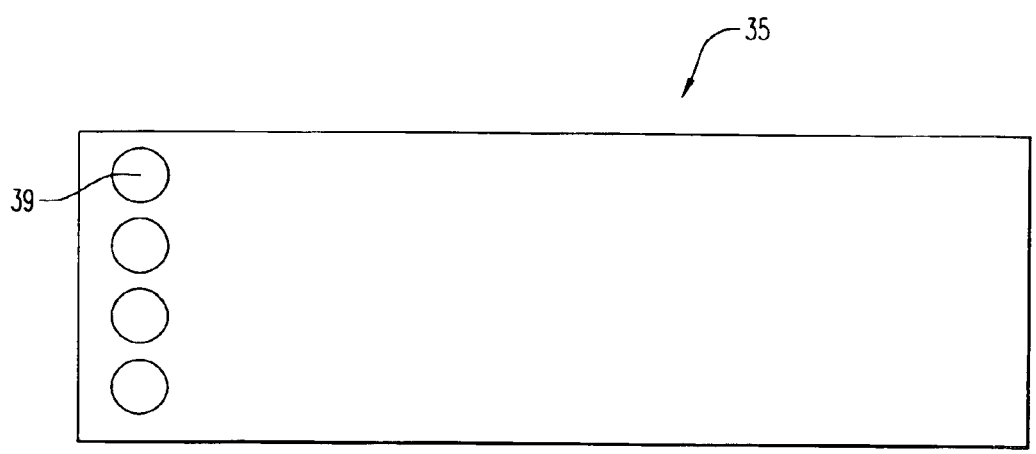
FIG. 2 is front view of an exemplary rack mount server suitable for use in the system of FIG. 1.

It is noted that rack mount electronic equipment, including rack mount servers can include a front panel LED fault/error/alert/status indicator. Further, the electronic equipment manufactured by various manufacturers and covering numerous models and types of equipment, has a fault/error/alert/status indicator(s) located on the left side of the rack mount equipment as depicted in FIG. 2.

Upon the occurrence of an alert (e.g., an error, fault, or predetermined status occurrence) in server 35, LED 39 is illuminated to provide a visual indication of the fault, error, or predetermined status occurrence. Under normal operating conditions door 15 is closed, thereby obscuring the viewing of the electronic equipment housed in rack enclosure 15. Alert indicator 39 on the front of server 35, for example, is therefore also obscured when door 15 is closed. Accordingly, it cannot be seen whether any of the electronic equipment in rack enclosure 10 is exhibiting an error, fault, or predetermined status occurrence (i.e., alert indicator LED 39 is illuminated) when door 15 is closed.

In an aspect of the present invention, a transceiver 50 is located on an interior surface of door 15, opposite fault indicator LED 39. Transceiver 50 is positioned such that it can detect the energy propagated by alert indicator LED 39. Preferably, transceiver 50 is located in an opposing, spaced apart relation to alert indicator LED 39 when door 15 is in the closed position, such as the interior hinge-side of door 15. Transceiver 50 is provided to detect light from LED 39. Transceiver 50 is preferably, though not limited to, a photodiode.

Upon detecting that LED 39 is illuminated, transceiver 50 allows a signal for activating a rack fault indicator 55 to be transmitted to and activate rack fault indicator 55. Rack fault indicator 55 is located on the exterior of rack enclosure 10 so as to be visible when door 15 is in the closed position. Rack fault indicator 55 is preferably located near the top of rack enclosure 10. In this manner, an error, fault, or predetermined status occurrence indicated by LED 39 is visually indicated at overall rack fault indicator 55 via transceiver 50. Accordingly, it can be readily determined if rack enclosure 10 is housing electronic equipment exhibiting a fault, error or predetermined status.

In an aspect of the present invention, transceiver 50 has a filter that filters out all light not within a particular wavelength range. That is, transceiver 50 only passes light having a wavelength within the particular wavelength range specified for the filter of transceiver 50. In an example of the present invention, LED 39 emits an amber colored light. In order to discern whether LED 39 is illuminated, in contrast to any other possible wavelengths of light produced by ambient or other lights sources (e.g., other LEDS on the electronic equipment), transceiver 50 preferably includes a non-amber light filter. The non-amber light filter only passes light having a wavelength corresponding to amber LED 39 (i.e., filters non-amber light).

In another aspect of the present invention, a plurality or an array of transceivers (e.g., photodiodes) are adjustably spaced along the interior of door 15. Transceivers 50 are arranged along the interior, hinge-side edge of door 15 such that photodiodes 15 are opposite LEDS 39 associated with the various individual electronic equipment units (e.g., switch 20, hub 25, and servers 35). The position of the transceivers 50 is adjustable to provide flexibility regarding the configuration of electronic equipment in rack enclosure 10. The position of transceiver(s) 50 may be adjusted by moving transceiver 50 vertically and/or horizontally. A track, a clip, a screw mount and other retaining means may be used for holding and positioning transceiver 50.

In another aspect of the present invention, transceiver 50 is connected to a switch 17. Upon the detection of light energy (i.e., a signal) from LED 39 by transceiver 50, switch 17 is closed. Closing of switch 17 activates (i.e., powers) rack fault indicator 55. Power for transceiver(s) 50 and rack fault indicator 55 is preferably supplied from the power source powering the electric equipment in rack enclosure 10. For example, power is supplied from UPS 40, PDU 45, or a battery (not shown) via a cable 19.

Figure 3:
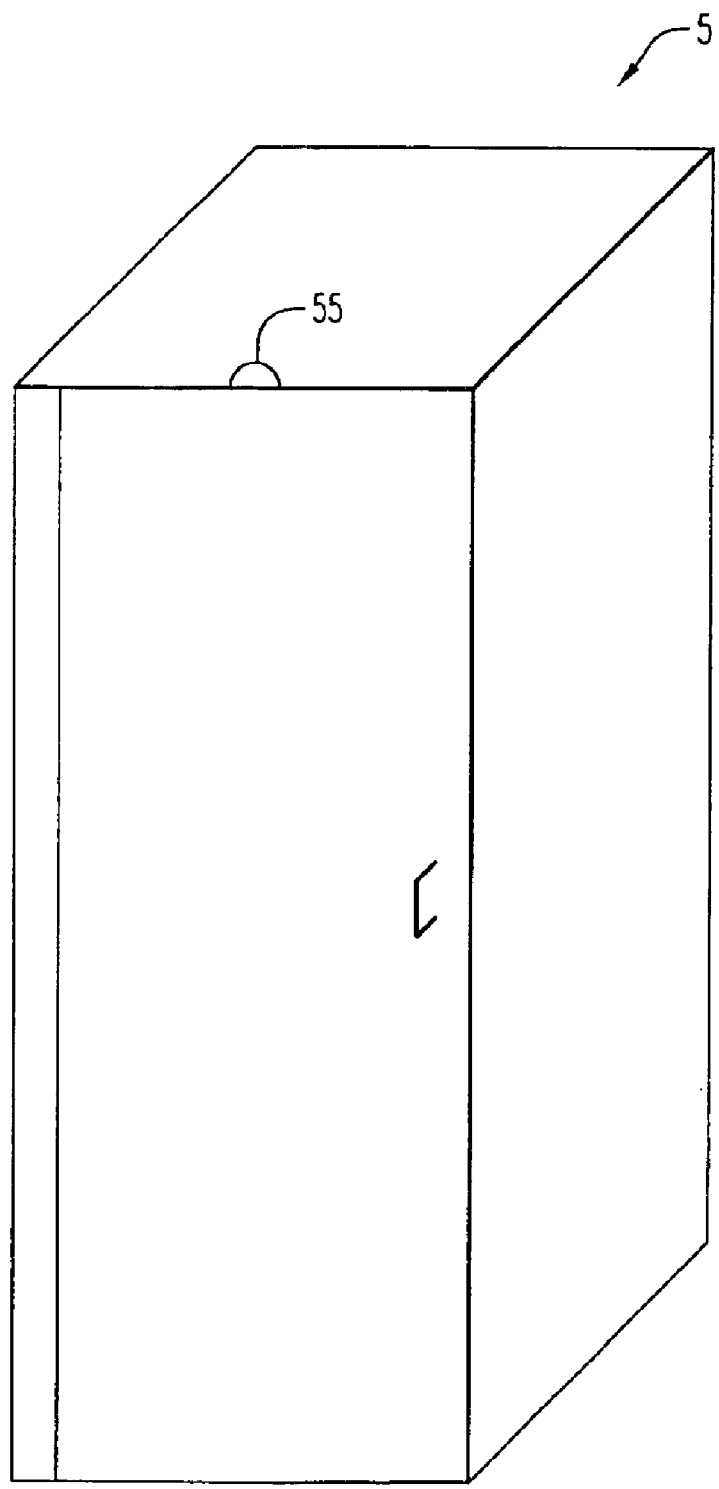
FIG. 3 is a perspective view of the computer-server rack enclosure fault light diagnostic system of FIG. 1, wherein the door thereof is in a closed position.

FIG. 3 depicts a perspective view of rack alert system 5, wherein door 15 is in the closed position. As discussed above, fault indicator LED 39 is not visible through perforated steel door 15. As clearly shown, rack fault indicator 55 is mounted to the exterior of rack enclosure 10 and is visible, even when door 15 is closed. Rack fault indicator 55 is preferably mounted near the top of rack enclosure 10. Rack fault indicator 55 may be mounted on the exterior surface of door 15, preferably near the top of rack enclosure 10. Mounting rack fault indicator 55 near the top of rack enclosure 10 facilitates a quick visual determination of whether rack enclosure 10 is housing electronic equipment exhibiting a fault, error or predetermined status occurrence even when door 15 is closed.

It should be appreciated that the rack enclosure 10, transceiver 50, and light source 39 discussed above are exemplary of the computer-server rack enclosure fault light diagnostic system of the present invention and do not preclude the inclusion, exclusion, and combination of other rack enclosures, transceivers or signal detectors, and error, fault, or predetermined status occurrence indicators other than the exemplary LED light source. The present invention has been disclosed to include a computer-server rack enclosure fault light diagnostic system that provides a quick visual determination of whether rack enclosure 10 is housing electronic equipment exhibiting a fault, even when the rack's door is closed, wherein the electronic equipment need not be modified, altered, or designed to include specialized fault indicator circuitry.

It should also be appreciated by those skilled in the art that the particular computer-server rack enclosure fault light diagnostic system configuration and other aspects of the invention herein are but examples of the present invention. Thus, they do not limit the scope or variety of applications that the present invention may be suitably implemented. Thus, it should be understood that the foregoing description is only illustrative of a present implementation of the teachings herein. Various alternatives and modification may be devised by those skilled in the art without departing from the invention. Accordingly, the present invention is intended to embrace all such alternatives, modifications, and variances that fall within the scope of the appended claims.

What is claimed is:

1. An alert system comprising:

a housing;

at least one unit, of electronic equipment comprising a rack mount server disposed in said housing, wherein said housing is capable of comprising a perforated door that substantially obscures direct viewing of the at least one unit of electronic equipment when the door is in a closed position.

an alert indicator disposed on said unit of electronic equipment for indicating said unit of electronic equipment has incurred a fault;

a housing alert indicator disposed on an exterior surface of said housing for indicating an overall housing level alert in response to said alert indicator indicating a fault; and a transceiver on a surface of said housing in opposing spaced apart relation to said alert indicator, wherein said transceiver is adjustably mounted to said housing.

2. The alert system of claim 1, wherein said housing alert indicator indicates said overall housing level alert in response to said transceiver detecting a signal indicative of a fault generated by said alert indicator.

3. The alert system of claim 1, wherein said transceiver is on a surface of a door in opposing spaced apart relation to said alert indicator when said door is in a closed position.

4. The alert system of claim 1, wherein said transceiver is a photodiode.

5. The alert system of claim 1, wherein said transceiver has a filter for filtering out a signal having a predetermined characteristic.

6. The alert system of claim 5, wherein predetermined characteristic is a non-amber light.

7. The alert system of claim 1, further comprising a switch connected between said transceiver and said housing alert indicator.

8. The alert system of claim 7, wherein said switch is closed in response to said transceiver detecting a fault indication by said alert indicator.

9. The alert system of claim 1, wherein said housing has a door attached thereto.

10. The alert system of claim 9, wherein said housing alert indicator is position on said exterior of said housing in a location visible when said door is in the closed position.

11. The alert system of claim 1, wherein said fault is selected from a group consisting of a fault, an error, and a predetermined status occurrence.

12. The alert system of claim 1, comprising at least one of switch, a hub, a disk controller, an expansion unit, a server, an uninterruptible power supply (UPS), and a power distribution unit (PDU).

13. The alert system of claim 1, wherein said alert indicator is a light emitting diode (LED).

14. The alert system of claim 1, wherein said alert system is an amber LED.

15. The alert system of claim 1, wherein said housing alert indicator is positioned substantially near the top of said housing.

* * * * *